US009609759B2

(12) United States Patent
Tew

(10) Patent No.: US 9,609,759 B2
(45) Date of Patent: Mar. 28, 2017

(54) METHOD AND SYSTEM FOR DEPOSITING AN OBJECT ONTO A WIRING BOARD

(71) Applicant: Hai San Tew, Penang Pulau Pinang (MY)

(72) Inventor: Hai San Tew, Penang Pulau Pinang (MY)

(73) Assignee: QDOS FLEXCIRCUITS SDN BHD, Bayan Lepas (MY)

(*) Notice: Subject to any disclaimer, the term of this patent is extended or adjusted under 35 U.S.C. 154(b) by 132 days.

(21) Appl. No.: 14/086,511

(22) Filed: Nov. 21, 2013

(65) Prior Publication Data

US 2014/0138027 A1 May 22, 2014

(30) Foreign Application Priority Data

Nov. 22, 2012 (MY) .............................. PI2012700985

(51) Int. Cl.
*B29C 65/00* (2006.01)
*H05K 3/30* (2006.01)
*B65G 37/00* (2006.01)
*H05K 1/18* (2006.01)
*H05K 13/00* (2006.01)

(52) U.S. Cl.
CPC ............ *H05K 3/305* (2013.01); *B65G 37/00* (2013.01); *H05K 1/189* (2013.01); *H05K 13/0061* (2013.01); *H05K 2201/2009* (2013.01); *H05K 2203/1105* (2013.01); *Y02P 70/613* (2015.11)

(58) Field of Classification Search
CPC ............... H05K 13/0061; H05K 3/305; H05K 2203/1105; B29C 66/0242

USPC .......................................................... 156/322
See application file for complete search history.

(56) References Cited

U.S. PATENT DOCUMENTS

| 3,944,046 | A | * | 3/1976 | Kubicek | ................ | B65G 47/57 |
| | | | | | | 198/464.2 |
| 4,030,717 | A | * | 6/1977 | Serlovsky | .......... | H05K 13/0069 |
| | | | | | | 228/37 |
| 5,019,201 | A | * | 5/1991 | Yabu | .................... | G02F 1/13452 |
| | | | | | | 156/273.9 |
| 5,747,102 | A | * | 5/1998 | Smith | ..................... | B05C 5/001 |
| | | | | | | 222/1 |
| 6,050,151 | A | * | 4/2000 | Larson | ................... | H05K 13/08 |
| | | | | | | 33/502 |
| 2005/0028360 | A1 | * | 2/2005 | Ireland | ................ | H05K 1/0271 |
| | | | | | | 29/840 |
| 2006/0082673 | A1 | * | 4/2006 | Kim | .................... | H01L 31/0203 |
| | | | | | | 348/340 |

(Continued)

FOREIGN PATENT DOCUMENTS

JP           03052763 A  *  3/1991

*Primary Examiner* — John Goff
(74) *Attorney, Agent, or Firm* — Preston Smirman; Smirman IP Law, PLLC

(57) ABSTRACT

A method of depositing one or more stiffener onto a wiring board includes the steps of engaging the wiring board onto a heat-retaining pallet to form an assembly, pre-heating the assembly to a temperature ranged from 70 to 140° C., and disposing the stiffeners onto the pre-heated wiring board of the assembly, wherein the pallet of the assembly retains sufficient heat for the wiring board to at least partially melt the stiffener, more preferably adhesive stiffener, to fix onto the wiring board upon disposition of the stiffeners.

3 Claims, 1 Drawing Sheet

(56) References Cited

U.S. PATENT DOCUMENTS

2006/0102703 A1* 5/2006 Akhtar ............... B23K 37/0408
                                                    228/260
2009/0176080 A1* 7/2009 Lai ........................... B32B 7/12
                                                    174/254

* cited by examiner

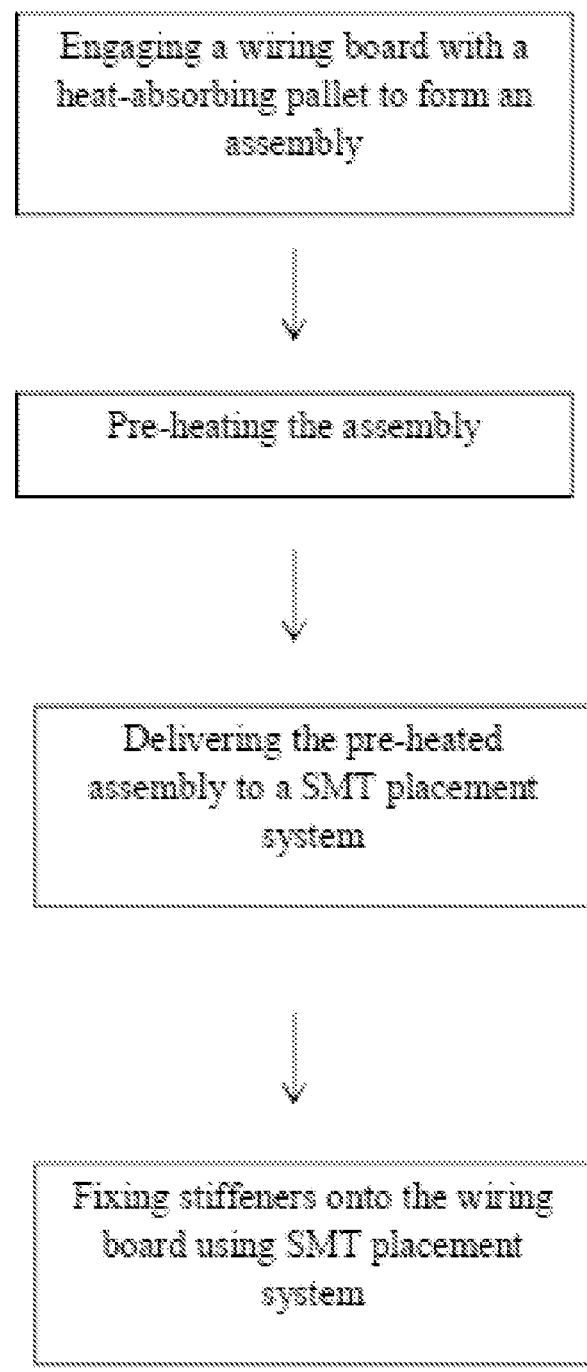

METHOD AND SYSTEM FOR DEPOSITING AN OBJECT ONTO A WIRING BOARD

CROSS-REFERENCE TO RELATED APPLICATION

The instant application claims priority to Malaysian Patent Application Serial No. PI2012700985, filed Nov. 22, 2012, the entire specification of which is expressly incorporated herein by reference.

FIELD OF INVENTION

The present invention relates to a method of depositing or adhering stiffeners onto a wiring board using a surface mounting technology (SMT) placement system, or simply a pick-and-place system. Particularly, the disclosed method facilitates adhering of the stiffeners once being deposited onto the wiring board. The adhered stiffener is free from the hassle of misplacement owing to continuous movement of the wiring board along the fabrication processes. Moreover, the disclosed invention also includes a SMT system capable of employing the mentioned stiffener deposition method.

BACKGROUND OF THE INVENTION

Trending towards improved portability, each new generation of electronic devices are designed with significant reduction in dimension or size. Reduced dimension poses great challenges in device manufacturing as only limited space is provided within the outer frame for housing various electronic components. The challenge becomes greater with increased features being packed into the electronic devices such as mobile phone. To squeeze all the electronic components and the connecting circuit board into limited space available, flexible circuit board or flexible wiring board are commonly used to achieve better components arrangement. Specifically, the flexible wiring board is resiliently bendable thus rendering it the ideal platform to functionally connect the mounted components and being accommodated within the frame without much difficulty. Owing to its physical properties, the flexible wiring board tends to be broken or ruptured if loaded with electronic components heavy in weight. To prevent such unwanted breakage of the board, stiffeners are normally fixed onto the flexible wiring board to improve its structural integrity especially at the spot where the heavy components to be mounted on. Stiffeners are thin films which are light in weight. It tends to being slightly shifted on the flexible wiring board following movement of the conveyor in the fabrication machine if it was not fixed using an adhesive. Fixing of the stiffeners are generally performed manually that the task is laborious and greatly reduces efficiency of the overall wiring board printing process. Consequently, there exists a need to develop fully automated process flow to expedite the stiffeners deposition process.

SUMMARY OF THE INVENTION

The present invention aims to provide a method to facilitate automated deposition of stiffeners onto a wiring board, particularly a flexible wiring board.

Another object of the present invention is to offer an improved approach to process flexible wiring circuits.

A further object of the present invention is to disclose a SMT placement system capable of automatically and securely disposing stiffeners onto a wiring board. Preferably, the SMT placement system possesses a pre-heating chamber to prepare the wiring board to fixedly receive the deposited stiffeners.

At least one of the preceding objects is met, in whole or in part, by the present invention, in which one of the embodiments of the present invention involves a method of depositing one or more stiffener onto a wiring board comprising the steps of engaging the wiring board onto a heat-retaining pallet to form an assembly, pre-heating the assembly at a temperature ranging from 70 to 140° C., and disposing the stiffeners onto the pre-heated wiring board of the assembly, wherein the pallet of the assembly retains sufficient heat for the wiring board to at least partially melt the stiffener, more preferably adhesive stiffener, to fix onto the wiring board upon disposition of the stiffeners.

Preferably, the stiffeners are disposed onto the wiring board using a SMT component placement system. With the pre-heating, the SMT component placement system enables fixation of the disposed stiffeners onto the wiring board without the use of additional adhesive. More preferably, the wiring board is a flexible circuit board.

In a further embodiment, the disclosed method can be modified to mount the electronic components onto the wiring board. Preferably, the method of mounting electronic components onto a wiring board comprises the steps of engaging the wiring board onto a heat-retaining pallet to form an assembly, pre-heating the assembly at a temperature ranging from 70 to 140° C., disposing the stiffeners onto the pre-heated wiring board of the assembly through a first automated machine, wherein the pallet of the assembly retains sufficient heat for the wiring board to at least partially melt the stiffener, more preferably adhesive stiffener, to fix onto the wiring board upon disposition of the stiffeners, and positioning the electronic components onto the fixed stiffeners through a second automated machine. Additionally, the disclosed method may include, as well, heating the wiring board prior to positioning of the electronic components in another further embodiment.

In one embodiment, the present invention discloses a SMT placement system or pick-and-place system. Preferably, the system comprises an operating section having one or more robotic arms equipped with a nozzle to pick and place an object onto a wiring board using suction force, a pre-heating chamber arranged to heat the wiring board prior to entering the operating section, a conveyor delivering the wiring board from the pre-heating chamber and the operating section, and a control panel providing an interface for a user to configure the pick-and-place system.

In another embodiment, the system further comprises one or more sensors mounted onto the pre-heating chamber and/or the operating section to monitor movement of the wiring board in between the pre-heating chamber and the operating section.

BRIEF DESCRIPTION OF THE DRAWINGS

The FIGURE shows an illustrative process flow of the present invention.

DETAILED DESCRIPTION OF THE INVENTION

One skilled in the art will readily appreciate that the present invention is well adapted to carry out the objects and obtain the ends and advantages mentioned, as well as those inherent therein. The embodiments described herein are not intended as limitations on the scope of the invention.

The terms "stiffener" and "adhesive stiffener" are used interchangeably throughout the specification unless mentioned otherwise. Preferably, but not limited to, the stiffeners showing adhering properties or become adhesive upon being at least partially molten.

One embodiment of the present inventions is a method of depositing one or more stiffeners onto a wiring board comprising the steps of:

engaging the wiring board onto a heat-retaining pallet to form an assembly;

pre-heating the assembly to a temperature ranging from 70 to 140° C.; and disposing the stiffeners onto the pre-heated wiring board of the assembly, wherein the pallet of the assembly retains sufficient heat for the wiring board to at least partially melt the stiffener, more preferably adhesive stiffener, to fix onto the wiring board upon disposition of the stiffeners.

The stiffeners used in the present invention are preferably, but not limited to, polyimide, polyamideimide or other derivatives derived thereof. Moreover, the stiffeners have relatively lower melting points or softening points compared to the base material used to fabricate the flexible wiring board to ensure that only the adhesive stiffener is at least partially soften or molten once contacted onto the flexible wiring board at the temperature substantially close to the pre-heated temperature of the flexible wiring board. As indicated in the foregoing description, the present invention realizes securing of the stiffeners onto the flexible wiring board through at least partially softened or molten adhesive stiffeners once the stiffeners were contacted to the pre-heated wiring board. With more stiffeners to be secured, it takes more time to finish the attachment and heat may be dissipated off the pre-heated wiring board along the process leading to failure in securely fixing the stiffeners onto the wiring board. It is possible to heat the wiring board to a much higher temperature to ensure the surface temperature of the wiring board can last long enough for attachment of various amount of stiffeners by subjecting the wiring board to the risk of decomposition. Alternatively, the present invention engages the wiring board to be processed with the heat-retaining pallet to sustain the surface temperature of the wiring board to a period sufficiently long until all the stiffeners are mounted. More specifically, the heat-retaining pallet has a heat absorbing property as well that it absorbs a fraction of heat energy in the pre-heating step and, later, supplies or transfers the absorbed heat to the wiring board during the stiffeners securing process. The pallet can be produced from any material or alloy with acceptable heat conductance. More preferably, the pallet is made of DURASTONE®. The pallet is sized to a dimension substantially similar to or slightly larger than the wiring board.

Preferably, the wiring board is engaged onto the pallet using one or more locking pins or even clamps to avoid dislodgement of the wiring board during the disclosed process. Nevertheless, it is possible as well to engage the wiring board onto the pallet by simply laying the wiring board on top of the pallet if enough friction is present in between the overlaid wiring board and the pallet. Alternatively, the pallet may be shaped into a mold-like structure capable of adaptively housing the laid down wiring board. For example, a flat indentation may be made onto the pallet to allow the wiring board to be positioned thereof with the surrounding raised edges to detain and/or hold the wiring board in place.

As mentioned in the foregoing description, the stiffeners are disposed onto the wiring board using a SMT component placement system to enhance efficiency of the flexible wiring board printing process. The disclosed method is applicable for any known type SMT placement system. With the increased temperature on the surface of the wiring board, the SMT placement system picks the prepared stiffeners from a storing tray, and thus, is able to fix the stiffeners onto the wiring board securely. Preferably, the stiffeners are prepared into a predetermined dimension and loaded into the storing tray for being processed by the SMT placement system to fix on the wiring board. In one embodiment, the surface of the stiffeners is in direct contact with flexible wiring board and is coated with a layer of heat-activated adhesive, which is activated by the heated surface of the wiring board so as to instantly stick the stiffeners onto the wiring board. More preferably, the heat-activated adhesive is activated at a temperature lower than the softened or molten temperature of the stiffener. Preferably, in the embodiment employing a heat-activated adhesive, the pre-heating temperature of the assembly is relatively lower than the embodiment free from using the adhesive.

In another embodiment, the disclosed method is further improved to enhance its application for flexible wiring board printing. Preferably, it is a method of mounting electronic components onto a wiring board comprising the steps of:

engaging the wiring board onto a heat-retaining pallet to form an assembly;

pre-heating the assembly at a temperature ranging from 70 to 140° C.;

disposing the stiffeners onto the pre-heated wiring board of the assembly through a first automated machine;

wherein the pallet of the assembly retains sufficient heat for the wiring board to at least partially melt the adhesive stiffener to fix onto the wiring board upon disposition of the stiffeners; and positioning the electronic components onto the fixed stiffeners through a second automated machine.

Likewise, the heat-retaining pallet used in this method aims to supply or transfer the absorbed heat, from the pre-heating step, to the wiring board to fix the stiffeners disposed onto the wiring board. The pallet can be produced from any material or alloy with acceptable heat conductance. One or more locking pins or clamps, but not limited thereto, can be used to hold the wiring board onto the pallet throughout the printing process. Or, in other embodiment, raised protrusions are fabricated on the surface of the pallet to define the position of the wiring board and these raised protrusions prevent lateral movement of the wiring board on the pallet once it was laid down. According to another embodiment, the disclosed method for electronic components mounting further comprises the step of heating the wiring board prior to and/or after positioning of the electronic components. The heating temperature preferably ranges in between 70 to 140° C.

Though the stiffeners and the electronic components are deposited using two different automated machines, a single automated machine can be used as well in the disclosed method to dispose both stiffeners and electronic components. In these embodiments, the electronic components are fixed onto the wiring board after the deposition of the stiffeners. Preferably, the automated machine described herein refers to a SMT component placement system. While in the embodiment utilizing two automated machines, namely the first and second automated machines, the second automated machine shall be located downstream of the first automated machine and the wiring board being processed by the first automated machine is delivered to the second automated machine through a conveyor. Similarly, the first and second automated machines are both SMT placement systems.

The present invention also includes a pick-and-place system or a SMT placement system being devised to perform at least one disclosed embodiment described above. Preferably, the system comprises:

an operating section having one or more robotic arms equipped with a nozzle to pick and place an object onto a wiring board using suction force;

a pre-heating chamber arranged to heat the wiring board to a temperature ranging from 70 to 140° C. prior to entering the operating section;

a conveyor delivering the wiring board from the pre-heating chamber to the operating section; and a control panel providing an interface for a user to configure the pick-and-place system.

Preferably, the operating section of the SMT placement system described herein is akin to any known SMT system that the electronic components are mounted onto the wiring board at this section. The robotic arm in the operating section is configured to pick up the prepared stiffeners from the storing tray and place it onto the wiring board according to a programmed fashion being inputted using the control panel. Preferably, the nozzle used in the present invention is a suction nozzle that applies air suction force at its tip to draw the stiffeners out of the storing tray. The suction nozzle may apply slight pressure against the wiring board, but not necessary, upon deposition of the stiffeners to achieve better contact in between the stiffeners and the wiring board.

As set forth above, the pre-heating chamber of the present invention is preferably located upstream of the operating section such that the pre-heated assembly formed by the pallet and the wiring board is delivered to the operating section through the conveyor. More preferably, one or more sensors are established in the pre-heating chamber and/or the operating section to monitor movement of the wiring board in between the pre-heating chamber and the operating section. These sensors are located along the conveyor to track the movement of the wiring board and/or the assembly within the disclosed SMT placement system. Though the present invention preferably heats and/or pre-heats the assembly through heat diffusion by bringing the assembly close to one or more heated plates (e.g., hot plates), it is important to be noted herein that such a feature shall not be deemed as a limitation restricting the present invention. Moreover, the heat energy can be introduced into the assembly and/or the wiring board via irradiation. For example, the pre-heating chamber may be equipped with a microwave waveguide, in one embodiment, aiming to heat up the assembly when the assembly passes through the pre-heating chamber. The heated temperature of the assembly in such an embodiment significantly relies on the duration and the intensity of the irradiation.

Pursuant to another preferred embodiment, the disclosed system further comprises a heat-retaining pallet capable of engaging with the wiring board. The heat-retaining pallet is coupled with the wiring board to be processed to ensure sufficient heat preserved on the surface of the wiring board to facilitate fixation of the stiffeners. In one embodiment, the pallet is painted or prepared with a blackish appearance to attain better heat absorption and transfer. Likewise, the surface of the pallet may carry profiles for securing the laid down wiring board from moving at the horizontal axis to ensure precision of the disclosed system in depositing the stiffeners and/or electronic components.

The present disclosure includes as contained in the appended claims, as well as that of the foregoing description. Although this invention has been described in its preferred form with a degree of particularity, it is understood that the present disclosure of the preferred form has been made only by way of example and that numerous changes in the details of construction and the combination and arrangements of parts may be resorted to without departing from the scope of the invention.

What is claimed is:

1. A system, comprising:
a control panel providing an interface for a user to configure the system;
a heat-retaining pallet;
a wiring board engaged onto the heat-retaining pallet to form an assembly;
a pre-heating chamber configured to pre-heat the assembly to a temperature in the range of 70 to 140° C.
a conveyor delivering the assembly from the pre-heating chamber to an operating section, wherein the operating section includes one or more robotic arms equipped with a nozzle to pick and place an object onto the wiring board using a suction force; an automated machine; and
a stiffener to be deposited onto the wiring board of the assembly by the automated machine;
wherein the stiffener has a lower melting point or softening point relative to the wiring board and is coated with a layer of heat-activated adhesive, wherein the heat-retaining pallet is configured to retain sufficient heat to activate the heat-activated adhesive so as to adhere the stiffener onto the wiring board and permit the stiffener to partially melt onto the wiring board.

2. The system of claim 1, further comprising one or more sensors mounted onto the pre-heating chamber or the operating section to monitor movement of the wiring board in between the pre-heating chamber and the operating section.

3. The system of claim 1, wherein the heat-activated adhesive layer is activated at a temperature lower than the softening point or melting point temperature of the stiffener.

* * * * *